United States Patent
Dando et al.

(10) Patent No.: US 6,858,264 B2
(45) Date of Patent: Feb. 22, 2005

(54) CHEMICAL VAPOR DEPOSITION METHODS

(75) Inventors: Ross S. Dando, Nampa, ID (US); Philip H. Campbell, Meridian, ID (US); Craig M. Carpenter, Boise, ID (US); Allen P. Mardian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 10/132,003

(22) Filed: Apr. 24, 2002

(65) Prior Publication Data

US 2003/0203109 A1 Oct. 30, 2003

(51) Int. Cl.[7] .................................................. C23C 16/56
(52) U.S. Cl. .................... 427/569; 427/248.1; 134/1.1; 134/22.11; 134/31; 216/58; 216/74; 216/83
(58) Field of Search ............................ 427/569, 248.1; 134/1.1, 22.11, 31; 216/58, 74, 83

(56) References Cited

U.S. PATENT DOCUMENTS

| | | |
|---|---|---|
| 3,618,919 A | 11/1971 | Beck |
| 4,289,061 A | 9/1981 | Emmett |
| 4,438,724 A | 3/1984 | Doehler et al. |
| 4,545,136 A | 10/1985 | Izu et al. |
| 4,871,417 A | 10/1989 | Nishizawa et al. |
| 4,948,979 A | 8/1990 | Munakata et al. |
| 5,076,205 A | 12/1991 | Vowles et al. |
| 5,172,849 A | 12/1992 | Barten et al. |
| 5,223,113 A | 6/1993 | Kaneko et al. |
| 5,364,219 A | 11/1994 | Takahashi et al. |
| 5,445,491 A | 8/1995 | Nakagawa et al. |
| 5,498,292 A | 3/1996 | Ozaki .......................... 118/724 |
| 5,536,317 A | 7/1996 | Crain et al. .................. 118/664 |
| 5,562,800 A | 10/1996 | Kawamura et al. |
| 5,592,581 A | 1/1997 | Okase |
| 5,626,936 A | 5/1997 | Alderman |
| 5,640,751 A | 6/1997 | Faria |

(List continued on next page.)

FOREIGN PATENT DOCUMENTS

| | | | | |
|---|---|---|---|---|
| JP | 63-256460 | 10/1988 | | |
| JP | 4-100533 | 4/1992 | | |
| JP | 06342785 A | * 12/1994 | ........... | H01L/21/31 |
| JP | 8-34678 | 2/1996 | | |
| JP | 9-82650 | 3/1997 | | |
| JP | 10-223719 | 8/1998 | | |
| JP | 2001-82682 | 3/2001 | | |
| JP | 2001-261375 | 9/2001 | | |

OTHER PUBLICATIONS

U.S. Appl. No. 10/082,599, filed Feb. 22, 2002, Carpenter et al.
U.S. Appl. No. 10/132,767, filed Apr. 24, 2002, Dando et al.
U.S. Appl. No. 10/365,085, filed Feb. 11, 2003, Carpenter et al.

*Primary Examiner*—Timothy Meeks
(74) *Attorney, Agent, or Firm*—Wells St. John P.S.

(57) ABSTRACT

A chemical vapor deposition chamber has a vacuum exhaust line extending therefrom. Material is deposited over a first plurality of substrates within the deposition chamber under conditions effective to deposit effluent product over internal walls of the vacuum exhaust line. At least a portion of the vacuum exhaust line is isolated from the deposition chamber. While isolating, a cleaning fluid is flowed to the vacuum exhaust line effective to at least reduce thickness of the effluent product over the internal walls within the vacuum exhaust line from what it was prior to initiating said flowing. After said flowing, the portion of the vacuum exhaust line and the deposition chamber are provided in fluid communication with one another and material is deposited over a second plurality of substrates within the deposition chamber under conditions effective to deposit effluent product over internal walls of the vacuum exhaust line.

58 Claims, 2 Drawing Sheets

U.S. PATENT DOCUMENTS

| | | |
|---|---|---|
| 5,693,288 A | 12/1997 | Nakamura |
| 5,746,434 A | 5/1998 | Boyd et al. |
| 5,769,952 A | 6/1998 | Komino |
| 5,820,641 A | 10/1998 | Gu et al. ............... 55/269 |
| 5,827,370 A | 10/1998 | Gu ....................... 118/715 |
| 5,940,684 A | 8/1999 | Shakuda et al. |
| 5,997,588 A | 12/1999 | Goodwin et al. |
| 6,016,611 A | 1/2000 | White et al. |
| 6,045,620 A | 4/2000 | Tepman et al. |
| 6,089,543 A | 7/2000 | Freerks |
| 6,174,366 B1 | 1/2001 | Ihantola |
| 6,178,660 B1 | 1/2001 | Emmi et al. |
| 6,192,827 B1 | 2/2001 | Welch et al. |
| 6,193,802 B1 | 2/2001 | Pang et al. ............ 118/715 |
| 6,194,628 B1 | 2/2001 | Pang et al. ............ 588/900 |
| 6,197,119 B1 | 3/2001 | Dozoretz et al. ...... 118/715 |
| 6,200,415 B1 | 3/2001 | Maraschin |
| 6,255,222 B1 | 7/2001 | Xia et al. .............. 438/710 |
| 6,263,829 B1 | 7/2001 | Schneider et al. |
| 6,280,584 B1 | 8/2001 | Kumar et al. |
| 6,347,918 B1 | 2/2002 | Blahnik |
| 6,506,254 B1 | 1/2003 | Bosch et al. |
| 6,541,353 B1 | 4/2003 | Sandhu et al. |
| 6,673,196 B1 | 1/2004 | Oyabu |
| 2001/0054484 A1 | 12/2001 | Komino .................. 155/345 |
| 2002/0185067 A1 * | 12/2002 | Upham .................. 118/715 |
| 2002/0195201 A1 | 12/2002 | Beer et al. |
| 2004/0007188 A1 | 1/2004 | Burkhart et al. ....... 118/733 |

* cited by examiner

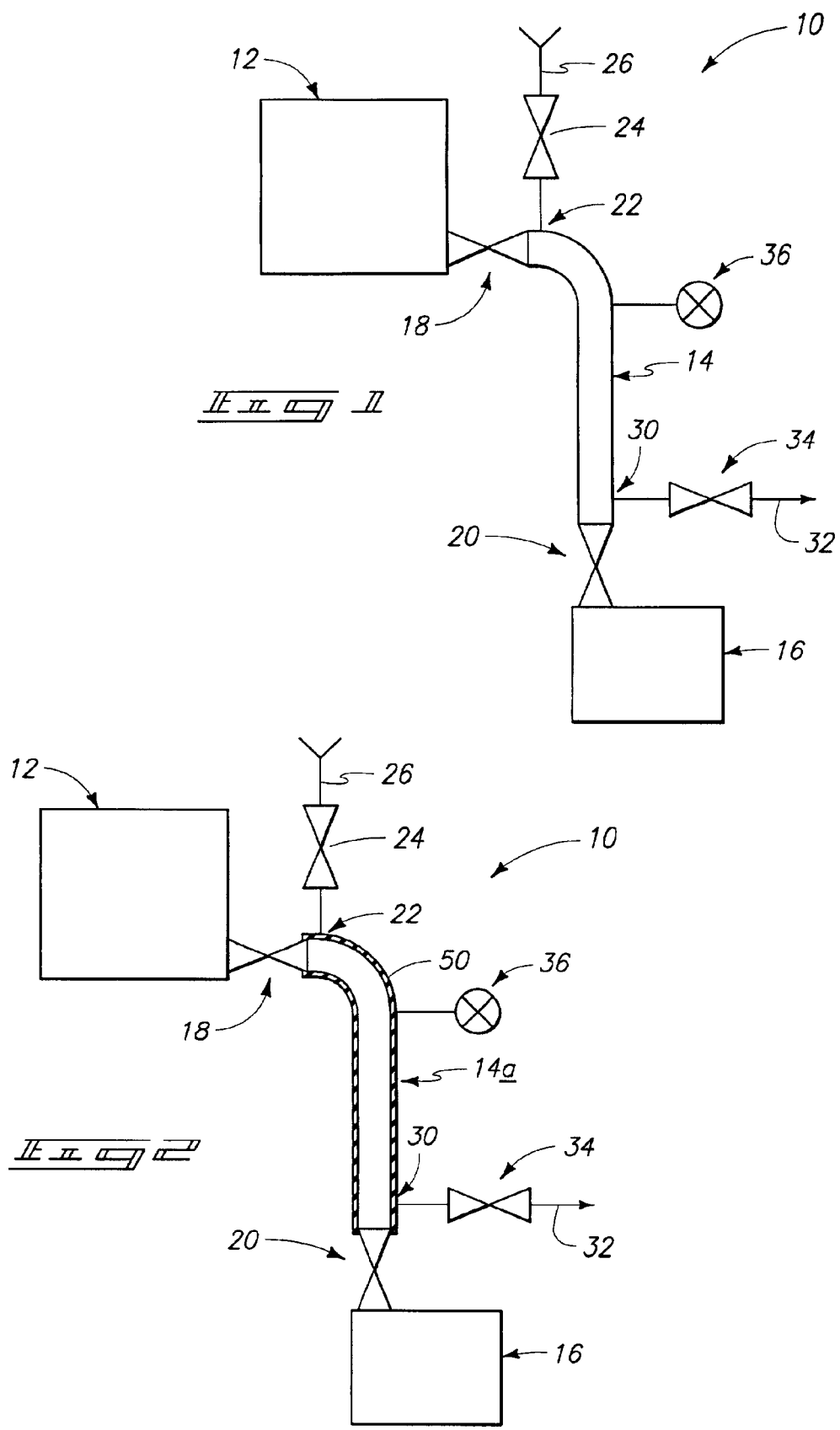

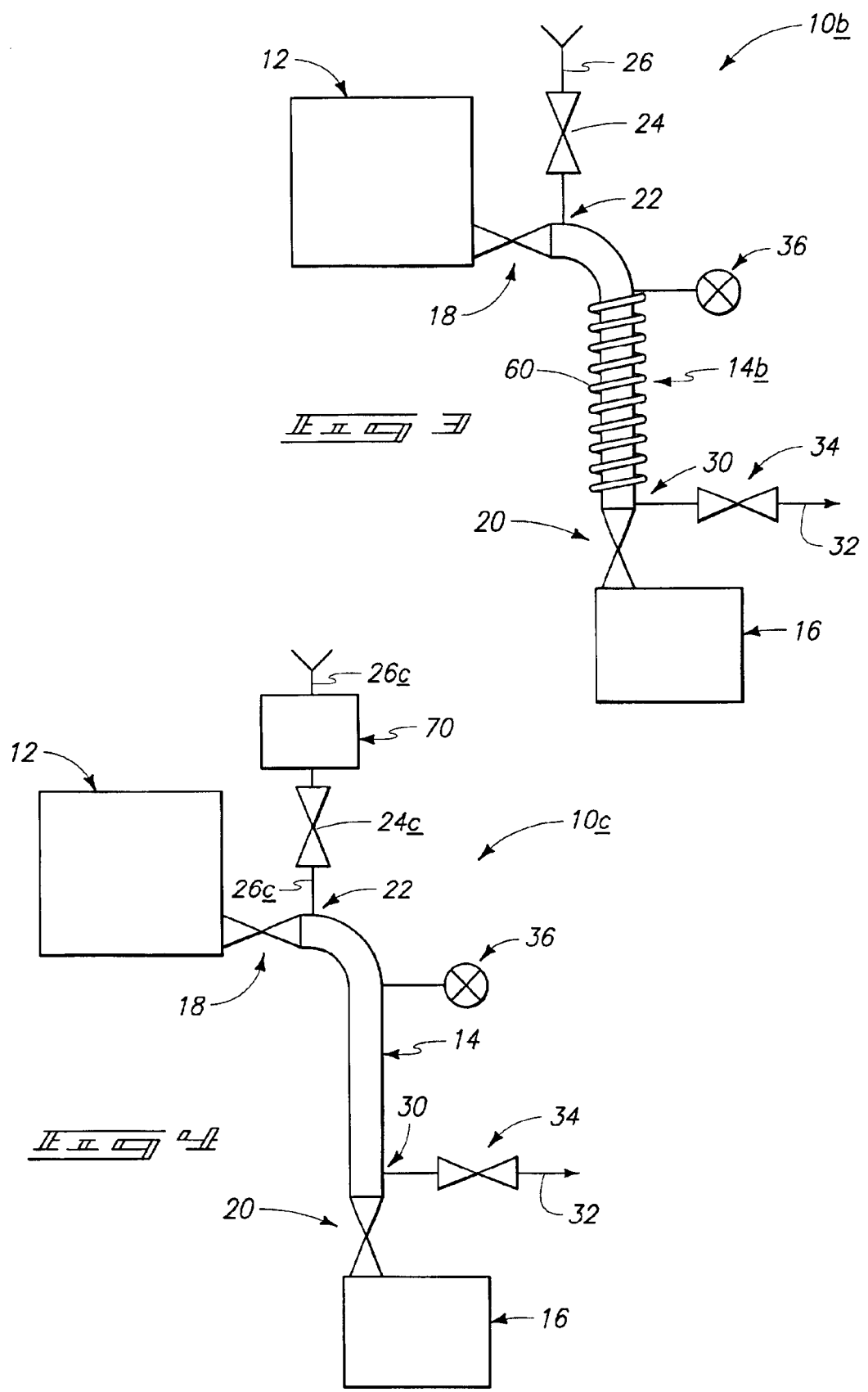

CHEMICAL VAPOR DEPOSITION METHODS

TECHNICAL FIELD

This invention relates to chemical vapor deposition methods.

BACKGROUND OF THE INVENTION

Semiconductor processing in the fabrication of integrated circuitry typically includes the deposition of layers on semiconductor substrates. Exemplary processes include physical vapor deposition (PVD), and chemical vapor deposition (CVD) which herein includes atomic layer deposition (ALD). With typical ALD, successive mono-atomic layers are adsorbed to a substrate and/or reacted with the outer layer on the substrate, typically by successive feeding of different precursors to the substrate surface.

Chemical vapor depositions can be conducted within chambers or reactors which retain a single substrate upon a wafer holder or susceptor. Typically, depositions are conducted at subatmospheric pressure. The chambers are maintained at subatmospheric pressure by one or more vacuum exhaust lines extending therefrom and through which undeposited effluent material flows. In certain chemical vapor deposition processes, for example in ALD, a deposition precursor might be pulsed to the chamber. When the flow of such precursor is not occurring to the chamber, the precursor might be diverted to flow directly to the exhaust line and thereby by-pass the deposition chamber. Further in certain of these and other processes, another deposition precursor might be continuously flowed to the chamber while an intermittent precursor is pulsed between the chamber and the exhaust line. These and other processings can result in considerable deposition of product within the exhaust line(s). If allowed to build up, this can lead to less vacuum pressure, and eventually result in nearly complete occluding of the exhaust line. Exemplary prior art methods for contending with the cleaning of the exhaust line include the complete removal and cleaning of the exhaust line from the deposition equipment, thereby undesirably providing considerable downtime for the equipment. Alternately, a cleaning fluid jacket is provided along the internal exhaust line surfaces, with the cleaning fluid flowing during the deposition of product onto substrates within the chamber to avoid any deposition in the first place.

The invention was motivated in addressing or overcoming the above-described drawbacks, although it is in no way so limited. The invention is only limited by the accompanying claims as literally worded without interpretative or other limiting reference to the specification or drawings, and in accordance with the doctrine of equivalents.

SUMMARY

The invention includes chemical vapor deposition methods. In one implementation, a chemical vapor deposition chamber has a vacuum exhaust line extending therefrom. Material is deposited over a first plurality of substrates within the deposition chamber under conditions effective to deposit effluent product over internal walls of the vacuum exhaust line. At least a portion of the vacuum exhaust line is isolated from the deposition chamber. While isolating, a cleaning fluid is flowed to the vacuum exhaust line effective to at least reduce thickness of the effluent product over the internal walls within the vacuum exhaust line from what it was prior to initiating said flowing. After said flowing, the portion of the vacuum exhaust line and the deposition chamber are provided in fluid communication with one another and material is deposited over a second plurality of substrates within the deposition chamber under conditions effective to deposit effluent product over internal walls of the vacuum exhaust line.

Further implementations are contemplated.

BRIEF DESCRIPTION OF THE DRAWINGS

Preferred embodiments of the invention are described below with reference to the following accompanying drawings.

FIG. 1 is a diagrammatic sectional view of an exemplary chemical vapor deposition apparatus.

FIG. 2 is a diagrammatic sectional view of an exemplary chemical vapor deposition apparatus.

FIG. 3 is a diagrammatic sectional view of an exemplary chemical vapor deposition apparatus.

FIG. 4 is a diagrammatic sectional view of an exemplary chemical vapor deposition apparatus.

DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Referring to FIG. 1, exemplary chemical vapor deposition equipment utilizable in a chemical vapor deposition method in accordance with preferred aspects of the invention is diagrammatically depicted and indicated generally with reference numeral 10. Such comprises a chemical vapor deposition chamber 12 having a vacuum exhaust line 14 extending therefrom. Vacuum exhaust line 14 extends between and interconnects with chamber 12 and at least one deposition vacuum pump 16. In the context of this document, a "deposition vacuum pump" is any vacuum pump which operates at least during the deposition of material onto substrates within a deposition chamber, and which is in fluid communication therewith during such deposition. Exemplary apparatus 10 is depicted as including a first isolation valve 18 and a second isolation valve 20. First isolation valve 18 is configured to isolate at least first majorities of exhaust line 14 and deposition chamber 12 from one another. First isolation valve 18 is preferably within 12 inches of an outlet from deposition chamber 12, and more preferably within 6 inches of the outlet from deposition chamber 12. Second isolation valve 20 is shown as being downstream of first isolation valve 18, and is configured to isolate at least a second majority of exhaust line 14 and deposition vacuum pump 16 from one another. Second isolation valve 20 is preferably received within 12 inches of an inlet to the deposition vacuum pump, and more preferably within 6 inches of such inlet.

Exhaust line 14 includes a cleaning fluid inlet 22 thereto which is proximate to and downstream of isolation valve 18, and upstream of second isolation valve 20. Inlet 22 is also preferably within 12 inches of an outlet of isolation valve 18, and more preferably within 6 inches of such outlet. Inlet 22 might be configured for feeding one or both of gas and liquid to vacuum exhaust line 14.

A valve 24 is shown as being associated with a cleaning fluid inlet line 26 feeding to cleaning fluid inlet 22. A cleaning fluid outlet 30 is depicted within exhaust line 14 proximate second isolation valve 20. Such connects with a cleaning line 32 having an outlet control valve 34 associated therewith. A pressure regulator/controller 36 is shown associated with vacuum exhaust line 14, and would be associated with pump 16 for controlling vacuum pressure within exhaust line 14 and, accordingly, deposition chamber 12 during operation.

The above-described equipment is diagrammatically shown and exemplary only. No method claim appended hereto is in any way limited by this or any other structural aspect of chemical vapor deposition equipment unless literally appearing in such claim(s), and without limiting or other interpretative reference to the specification or drawings.

In accordance with an aspect of the invention, material is deposited over a first plurality of substrates within a deposition chamber, for example deposition chamber 12, under conditions effective to deposit effluent product over the internal walls of a vacuum exhaust line, for example exhaust line 14. Typically, the depositing on the substrates would occur within the deposition chamber one wafer/substrate at a time, although multiple substrate depositions within a chamber at the same time are also of course contemplated. The deposited effluent product might comprise multiple different materials or, by way of example only, a single homogenous material.

After such depositing, at least a portion of the vacuum exhaust line is isolated from the deposition chamber. Such isolating preferably results from the operation of one or more valves, for example with first isolation valve 18 in the FIG. 1 depicted embodiment. Preferably and as shown in FIG. 1, such isolating results in at least a majority of vacuum exhaust line 14 and at least a majority of chamber 12 being isolated from one another. In one embodiment, at least a second majority (might be the same as the first) of a vacuum exhaust line is isolated from the deposition vacuum pump utilizing a second isolation valve, for example isolation valve 20.

Regardless, while isolating, a cleaning fluid is flowed to the vacuum exhaust line effective to at least reduce the thickness of the effluent product over the internal walls within the vacuum exhaust line from what it was prior to initiating such flowing. In one preferred embodiment, the isolating starts before flowing any cleaning fluid to the vacuum exhaust line. In another preferred embodiment, the isolating starts after the flowing of the cleaning fluid has begun. The cleaning fluid might comprise gas or liquid, consist essentially of gas or essentially of liquid, or comprise a mixture of gas and liquid, for example at least 10% gas and at least 10% liquid by volume. In the depicted example, the cleaning fluid might be directed to flow through isolation valve 20, or partially or totally diverted through cleaning fluid outlet 30 into line 32. For example, and by way of example only, where the cleaning fluid is predominately gas, such might desirably be directed through isolation valve 20 and pump 16 where the cleaning fluid is compatible with such valve and pump. Further by way of example only, where the cleaning fluid is predominately liquid, isolation valve 20 might be closed to isolate deposition vacuum pump 16 from the flowing cleaning fluid, which could be diverted through outlet 30 into line 32, for example where the pumping equipment is not configured or otherwise adapted for the liquid or material of the cleaning fluid.

Cleaning with such fluid might be conducted to be effective to remove all of the effluent product from the walls of exhaust line 14, or only effective to reduce the thickness of such product from what it was prior to the cleaning fluid flowing. In one preferred embodiment, the cleaning fluid flowing is effective to reduce the thickness of the effluent product by at least 50%. In one preferred embodiment, the cleaning fluid flowing is effective to expose at least some of the internal walls of the portion of the vacuum line which is being cleaned, and in a more preferred embodiment to expose at least 90% of such internal walls, and even more preferably to expose at least 99% of such internal walls.

After flowing the cleaning fluid, the portion of the vacuum exhaust line and the deposition chamber are provided back in fluid communication with one another, and material is deposited over a second plurality of substrates within the deposition chamber and under conditions effective to deposit effluent over the internal walls of the vacuum exhaust line. The material deposited on the second plurality of substrates may be the same or different as some or all of the material deposited over the first plurality of substrates. Further of course, the first plurality of substrates could be the same or different from the second plurality of substrates, or include overlapping substrates in both the first and second pluralities. Further, the effluent product deposited over the internal walls of the vacuum exhaust line could be the same or different as that deposited initially, and might also deposit directly on such walls or over material within the vacuum exhaust gas line which was not completely or otherwise removed during the cleaning fluid flowing. In one preferred embodiment, the flow of all the cleaning fluid is ceased prior to providing the portion of the vacuum exhaust line and the deposition chamber back in fluid communication with one another. In one preferred embodiment, the flowing of all the cleaning fluid is ceased after providing the portion of the vacuum exhaust line and the deposition chamber back in fluid communication with one another.

An alternate embodiment chemical vapor deposition method is described with respect to alternate chemical vapor deposition equipment 10a, as shown in FIG. 2. Like numerals from the first-described embodiment are utilized where appropriate, with differences being indicated with the suffix "a" or with different numerals. Vacuum exhaust line 14a is depicted as including a suitable heating jacket 50. Such can be utilized in an exemplary method in accordance with an aspect of the invention to heat the cleaning fluid while it is within vacuum exhaust 14a during the cleaning fluid flowing.

In accordance with aspects of the invention, a further chemical vapor deposition method is described with respect to chemical vapor deposition equipment 10b in FIG. 3. Like numerals from the first-described embodiment are utilized where appropriate, with differences being indicated with the suffix "b" or with different numerals. In FIG. 3, a vacuum exhaust line 14b is provided with a suitable exemplary RF coil 60, or other appropriate generator. Such could be utilized in a method in accordance with an aspect of the invention which includes generating a plasma with/from a cleaning gas flowing within exhaust line 14b during such cleaning fluid flowing.

Another exemplary chemical vapor deposition method is described in connection with chemical vapor deposition equipment 10c as depicted in FIG. 4. Like numerals from the first-described embodiment are utilized where appropriate, with differences being indicated with the suffix "c" or with different numerals. FIG. 4 depicts a remote plasma generating apparatus 70 associated with cleaning fluid inlet line 26c. Such could be utilized for generating a plasma with cleaning gas external of exhaust line 14 during the flowing of the cleaning fluid thereto.

By way of example only, exemplary deposited effluent within vacuum exhaust 14 might include any of $Al_2O_3$, $NH_4Cl$, $TiCl_4$, $TiCl_3$ and $TiCl_2$. Exemplary materials for cleaning the $Al_2O_3$ include liquid or gaseous $H_2O$, HCl, $NH_4OH$ and $ClF_3$. Exemplary cleaning fluids for $NH_4Cl$ include liquid or gaseous $H_2O_2$, $H_2O$ and $ClF_3$. Exemplary cleaning fluids for removing any of $TiCl_4$, $TiCl_3$ and $TiCl_2$ include liquid or gaseous $ClF_3$, $Cl_2$, $H_2O_2$ and $H_2O$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A chemical vapor deposition method comprising:
   providing a chemical vapor deposition chamber having a vacuum exhaust line extending therefrom, a deposition vacuum pump in fluid communication with the vacuum exhaust line;
   first depositing material over a first plurality of substrates within the deposition chamber under conditions effective to deposit effluent product over internal walls of the vacuum exhaust line;
   isolating at least a portion of the vacuum exhaust line from the deposition chamber;
   while isolating, flowing a cleaning fluid to the vacuum exhaust line effective to at least reduce thickness of the effluent product over the internal walls within the vacuum exhaust line from what it was prior to initiating said flowing, at least some of said flowing bypassing the deposition vacuum pump; and
   after said flowing, providing the portion of the vacuum exhaust line and the deposition chamber in fluid communication with one another and second depositing material over a second plurality of substrates within the deposition chamber under conditions effective to deposit effluent product over internal walls of the vacuum exhaust line.

2. The method of claim 1 comprising starting the isolating before flowing any of said cleaning fluid.

3. The method of claim 1 comprising starting the isolating after starting flowing of said cleaning fluid.

4. The method of claim 1 wherein the portion is at least a majority portion.

5. The method of claim 1 wherein the cleaning fluid comprises gas.

6. The method of claim 1 wherein the cleaning fluid consists essentially of gas.

7. The method of claim 1 wherein the cleaning fluid comprises liquid.

8. The method of claim 1 wherein the cleaning fluid consists essentially of liquid.

9. The method of claim 1 wherein the cleaning fluid comprises gas and liquid.

10. The method of claim 1 wherein the cleaning fluid comprises at least 10% gas and at least 10% liquid by volume.

11. The method of claim 1 wherein the cleaning fluid flowing is effective to reduce the thickness of the effluent product by at least 50%.

12. The method of claim 1 wherein the cleaning fluid flowing is effective to expose at least some of the internal walls of the portion of the vacuum exhaust line.

13. The method of claim 1 wherein the cleaning fluid flowing is effective to expose at least 90% of the internal walls of the portion of the vacuum exhaust line.

14. The method of claim 1 wherein the cleaning fluid flowing is effective to expose at least 99% of the internal walls of the portion of the vacuum exhaust line.

15. The method of claim 1 comprising ceasing flowing of all said cleaning fluid prior to the providing of the portion of the vacuum exhaust line and the deposition chamber back in fluid communication with one another.

16. The method of claim 1 comprising heating the cleaning fluid within the vacuum exhaust line during the flowing.

17. The method of claim 1 wherein the cleaning fluid comprises a gas, and further comprising generating a plasma with the cleaning gas within the exhaust line during the flowing.

18. The method of claim 1 wherein the cleaning fluid comprises a gas, and further comprising generating a plasma with the cleaning gas external of the exhaust line during the flowing.

19. The method of claim 1 wherein all said flowing bypasses the deposition vacuum pump.

20. A chemical vapor deposition method comprising:
   providing a chemical vapor deposition chamber having a vacuum exhaust line extending therefrom;
   first depositing material over a first plurality of substrates within the deposition chamber under conditions effective to deposit effluent product over internal walls of the vacuum exhaust line;
   isolating at least a portion of the vacuum exhaust line from the deposition chamber;
   while isolating, flowing a cleaning fluid to the vacuum exhaust line effective to at least reduce thickness of the effluent product over the internal walls within the vacuum exhaust line from what it was prior to initiating said flowing;
   after said flowing, providing the portion of the vacuum exhaust line and the deposition chamber in fluid communication with one another and second depositing material over a second plurality of substrates within the deposition chamber under conditions effective to deposit effluent product over internal walls of the vacuum exhaust line; and
   ceasing flowing of all said cleaning fluid after the providing of the portion of the vacuum exhaust line and the deposition chamber back in fluid communication with one another.

21. A chemical vapor deposition method comprising:
   providing a chemical vapor deposition chamber having a vacuum exhaust line extending therefrom, an isolation valve configured to isolate at least majorities of the exhaust line and the deposition chamber from one another, a deposition vacuum pump in fluid communication with the vacuum exhaust line, the exhaust line including a cleaning fluid inlet thereto proximate to and downstream of the isolation valve and upstream of the deposition vacuum pump, the exhaust line having a vacuum pump bypassing cleaning fluid outlet downstream of the cleaning fluid inlet and upstream of the deposition vacuum pump;
   first depositing material over a first plurality of substrates within the deposition chamber under conditions effective to deposit effluent product over internal walls of the vacuum exhaust line;
   after the first depositing, isolating said at least majorities of the vacuum exhaust line and the deposition chamber from one another with the isolation valve;

while the vacuum exhaust line is isolated from the deposition chamber by the isolation valve, flowing a cleaning fluid through the cleaning fluid inlet effective to at least reduce thickness of the effluent product over the internal walls within the vacuum exhaust line from what it was prior to initiating said flowing, said flowing comprising flowing at least some cleaning fluid through the cleaning fluid outlet upstream of the deposition vacuum pump; and after said flowing, operating the isolation valve effective to provide the vacuum exhaust line and the deposition chamber in fluid communication with one another and second depositing material over a second plurality of substrates within the deposition chamber under conditions effective to deposit effluent product over internal walls of the vacuum exhaust line.

22. The method of claim 21 wherein the isolation valve is received within six inches of an outlet from the deposition chamber.

23. The method of claim 21 wherein the isolation valve is received within twelve inches of an outlet from the deposition chamber.

24. The method of claim 21 comprising starting the isolating before flowing any of said cleaning fluid.

25. The method of claim 21 wherein the cleaning fluid comprises gas.

26. The method of claim 21 wherein the cleaning fluid consists essentially of gas.

27. The method of claim 21 wherein the cleaning fluid comprises liquid.

28. The method of claim 21 wherein the cleaning fluid consists essentially of liquid.

29. The method of claim 21 wherein the cleaning fluid comprises gas and liquid.

30. The method of claim 21 wherein the cleaning fluid flowing is effective to reduce the thickness of the effluent product by at least 50%.

31. The method of claim 21 wherein the cleaning fluid flowing is effective to expose at least some of the internal walls of the portion of the vacuum exhaust line.

32. The method of claim 21 comprising ceasing flowing of all said cleaning fluid prior to the providing of the portion of the vacuum exhaust line and the deposition chamber back in fluid communication with one another.

33. The method of claim 21 comprising heating the cleaning fluid within the vacuum exhaust line during the flowing.

34. The method of claim 21 wherein the cleaning fluid comprises a gas, and further comprising generating a plasma with the cleaning gas within the exhaust line during the flowing.

35. The method of claim 21 wherein the cleaning fluid comprises a gas, and further comprising generating a plasma with the cleaning gas external of the exhaust line during the flowing.

36. The method of claim 21 wherein said flowing comprises flowing all the cleaning fluid through the cleaning fluid outlet upstream of the vacuum pump.

37. A chemical vapor deposition method comprising:
providing a chemical vapor deposition chamber having a vacuum exhaust line extending therefrom, an isolation valve configured to isolate at least majorities of the exhaust line and the deposition chamber from one another, the exhaust line including a cleaning fluid inlet thereto proximate to and downstream of the isolation valve;

first depositing material over a first plurality of substrates within the deposition chamber under conditions effective to deposit effluent product over internal walls of the vacuum exhaust line;

after the first depositing, isolating said at least majorities of the vacuum exhaust line and the deposition chamber from one another with the isolation valve;

while the vacuum exhaust line is isolated from the deposition chamber by the isolation valve, flowing a cleaning fluid through the cleaning fluid inlet effective to at least reduce thickness of the effluent product over the internal walls within the vacuum exhaust line from what it was prior to initiating said flowing;

after said flowing, operating the isolation valve effective to provide the vacuum exhaust line and the deposition chamber in fluid communication with one another and second depositing material over a second plurality of substrates within the deposition chamber under conditions effective to deposit effluent product over internal walls of the vacuum exhaust line; and starting the isolating after starting flowing of said cleaning fluid.

38. A chemical vapor deposition method comprising:
providing a chemical vapor deposition chamber having a vacuum exhaust line extending therefrom, an isolation valve configured to isolate at least majorities of the exhaust line and the deposition chamber from one another, the exhaust line including a cleaning fluid inlet thereto proximate to and downstream of the isolation valve;

first depositing material over a first plurality of substrates within the deposition chamber under conditions effective to deposit effluent product over internal walls of the vacuum exhaust line;

after the first depositing, isolating said at least majorities of the vacuum exhaust line and the deposition chamber from one another with the isolation valve;

while the vacuum exhaust line is isolated from the deposition chamber by the isolation valve, flowing a cleaning fluid through the cleaning fluid inlet effective to at least reduce thickness of the effluent product over the internal walls within the vacuum exhaust line from what it was prior to initiating said flowing;

after said flowing, operating the isolation valve effective to provide the vacuum exhaust line and the deposition chamber in fluid communication with one another and second depositing material over a second plurality of substrates within the deposition chamber under conditions effective to deposit effluent product over internal walls of the vacuum exhaust line; and ceasing flowing of all said cleaning fluid after the providing of the portion of the vacuum exhaust line and the deposition chamber back in fluid communication with one another.

39. A chemical vapor deposition method comprising:
providing a chemical vapor deposition chamber having a vacuum exhaust line extending therefrom to at least one deposition vacuum pump, an isolation valve configured to isolate at least majorities of the exhaust line and the deposition chamber from one another, the exhaust line including a cleaning gas inlet thereto proximate to and downstream of the isolation valve;

first depositing material over a first plurality of substrates within the deposition chamber under conditions effective to deposit effluent product over internal walls of the vacuum exhaust line;

after the first depositing, isolating said at least majorities of the vacuum exhaust line and the deposition chamber from one another with the isolation valve;

while the vacuum exhaust line is isolated from the deposition chamber by the isolation valve, flowing a cleaning gas through the cleaning gas inlet effective to at least reduce thickness of the effluent product over the internal walls within the vacuum exhaust line from what it was prior to initiating said flowing, the cleaning gas flowing from the vacuum exhaust line through said deposition vacuum pump;

after said flowing, operating the isolation valve effective to provide the vacuum exhaust line and the deposition chamber in fluid communication with one another and second depositing material over a second plurality of substrates within the deposition chamber under conditions effective to deposit effluent product over internal walls of the vacuum exhaust line; and starting the isolating after starting flowing of said cleaning gas.

40. The method of claim 39 wherein the cleaning gas flowing is void of any liquid injection to the vacuum exhaust line.

41. The method of claim 39 wherein the isolation valve is received within six inches of an outlet from the deposition chamber.

42. The method of claim 39 wherein the isolation valve is received within twelve inches of an outlet from the deposition chamber.

43. The method of claim 39 wherein the cleaning gas flowing is effective to reduce the thickness of the effluent product by at least 50%.

44. The method of claim 39 wherein the cleaning gas flowing is effective to expose at least some of the internal walls of the portion of the vacuum exhaust line.

45. The method of claim 39 comprising ceasing flowing of all said cleaning gas prior to the providing of the portion of the vacuum exhaust line and the deposition chamber back in fluid communication with one another.

46. The method of claim 39 comprising heating the cleaning gas within the vacuum exhaust line during the flowing.

47. The method of claim 39 comprising generating a plasma with the cleaning gas within the exhaust line during the flowing.

48. The method of claim 39 comprising generating a plasma with the cleaning gas external of the exhaust line during the flowing.

49. A chemical vapor deposition method comprising:

providing a chemical vapor deposition chamber having a vacuum exhaust line extending therefrom to at least one deposition vacuum pump, an isolation valve configured to isolate at least majorities of the exhaust line and the deposition chamber from one another, the exhaust line including a cleaning gas inlet thereto proximate to and downstream of the isolation valve;

first depositing material over a first plurality of substrates within the deposition chamber under conditions effective to deposit effluent product over internal walls of the vacuum exhaust line;

after the first depositing, isolating said at least majorities of the vacuum exhaust line and the deposition chamber from one another with the isolation valve;

while the vacuum exhaust line is isolated from the deposition chamber by the isolation valve, flowing a cleaning fluid through the cleaning gas inlet effective to at least reduce thickness of the effluent product over the internal walls within the vacuum exhaust line from what it was prior to initiating said flowing, the cleaning gas flowing from the vacuum exhaust line through said deposition vacuum pump;

after said flowing, operating the isolation valve effective to provide the vacuum exhaust line and the deposition chamber in fluid communication with one another and second depositing material over a second plurality of substrates within the deposition chamber under conditions effective to deposit effluent product over internal walls of the vacuum exhaust line; and ceasing flowing of all said cleaning gas after the providing of the portion of the vacuum exhaust line and the deposition chamber back in fluid communication with one another.

50. A chemical vapor deposition method comprising:

providing a chemical vapor deposition chamber having a vacuum exhaust line extending therefrom to at least one deposition vacuum pump, a first isolation valve configured to isolate at least first majorities of the exhaust line and the deposition chamber from one another, a second isolation valve downstream of the first isolation valve configured to isolate at least a second majority of the exhaust line and the deposition vacuum pump from one another, the exhaust line including a cleaning liquid inlet thereto proximate to and downstream of the first isolation valve and upstream of the second isolation valve;

first depositing material over a first plurality of substrates within the deposition chamber under conditions effective to deposit effluent product over internal walls of the vacuum exhaust line;

after the first depositing, isolating said at least first majorities of the vacuum exhaust line and the deposition chamber from one another with the first isolation valve and isolating said at least second majority of the vacuum exhaust line and the deposition vacuum pump from one another with the second isolation valve;

while the vacuum exhaust line is isolated from the deposition chamber by the first isolation valve and is isolated from the deposition vacuum pump by the second isolation valve, flowing a cleaning liquid through the cleaning liquid inlet effective to at least reduce thickness of the effluent product over the internal walls within the vacuum exhaust line from what it was prior to initiating said flowing; and after said flowing, operating the first isolation valve effective to provide the vacuum exhaust line and the deposition chamber in fluid communication with one another and operating the second isolation valve effective to provide the vacuum exhaust line and the deposition vacuum pump in fluid communication with one another, and second depositing material over a second plurality of substrates within the deposition chamber under conditions effective to deposit effluent product over internal walls of the vacuum exhaust line.

51. The method of claim 50 wherein the cleaning liquid flowing is void of any gas injection to the vacuum exhaust line.

52. The method of claim 50 wherein the first isolation valve is received within six inches of an outlet from the deposition chamber and the second isolation valve is received within six inches of an inlet to the deposition vacuum pump.

53. The method of claim 50 wherein the first isolation valve is received within twelve inches of an outlet from the deposition chamber and the second isolation valve is received within twelve inches of an inlet to the deposition vacuum pump.

54. The method of claim 50 comprising starting the isolating before flowing any of said cleaning liquid.

55. The method of claim 50 wherein the cleaning liquid flowing is effective to reduce the thickness of the effluent product by at least 50%.

56. The method of claim 50 wherein the cleaning liquid flowing is effective to expose at least some of the internal walls of the portion of the vacuum exhaust line.

57. The method of claim 50 comprising ceasing flowing of all said cleaning liquid prior to the providing of the portion of the vacuum exhaust line and the deposition chamber back in fluid communication with one another.

58. The method of claim 50 comprising heating the cleaning liquid within the vacuum exhaust line during the flowing.

* * * * *

UNITED STATES PATENT AND TRADEMARK OFFICE
CERTIFICATE OF CORRECTION

PATENT NO. : 6,858,264 B2
DATED : February 22, 2005
INVENTOR(S) : Dando et al.

It is certified that error appears in the above-identified patent and that said Letters Patent is hereby corrected as shown below:

Column 9,
Line 64, please delete "fluid" after "ing" and insert -- gas --.

Signed and Sealed this

Twenty-seventh Day of September, 2005

JON W. DUDAS
*Director of the United States Patent and Trademark Office*